United States Patent
Lee

(10) Patent No.: US 7,030,490 B2
(45) Date of Patent: Apr. 18, 2006

(54) STRUCTURE OF MULTI-TIER WIRE BONDING FOR HIGH FREQUENCY INTEGRATED CIRCUIT

(75) Inventor: Sheng-Yuan Lee, Taipei (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 10/790,840

(22) Filed: Mar. 3, 2004

(65) Prior Publication Data

US 2005/0017352 A1    Jan. 27, 2005

(30) Foreign Application Priority Data

Jul. 22, 2003    (TW) .............................. 92119908 A

(51) Int. Cl.
*H01L 23/34*    (2006.01)
(52) U.S. Cl. ...................... 257/728; 257/786
(58) Field of Classification Search ................ 257/728, 257/786

See application file for complete search history.

(56) References Cited

U.S. PATENT DOCUMENTS 6,538,336 B1 *    3/2003    Secker et al. ................ 257/786

* cited by examiner

*Primary Examiner*—Tu-Tu Ho
(74) *Attorney, Agent, or Firm*—Troxell Law Office, PLLC

(57)    ABSTRACT

A multi-wire wire-bonding structure suitable for a high frequency signal comprises a first electronic device, a second electronic device, a chip pad and a plurality of metal wires. The first electronic device is attached to the second electronic device with the chip pad. As a result, the first electronic device and the second electronic device form a stair-like structure. A plurality of bonding pads comprises at least one signal bonding pad and grounded bonding pads. The signal bonding surface is surrounded by the ground bonding pads. All the bonding pads are located at the surface of the first electronic device. The chip pad carries the first electronic device and the exceeding part is a ring grounded bonding pad which surrounds the first electronic device. The second electronic device carries the chip pad and a margin of the second electronic device is exceeding the chip pad. There are several leads on the margin of the second electronic device in corresponding to the ground bonding pads and the signal bonding pad. Metal wires comprise a signal wire and grounding wires. The bonding pads of the first electronic device are classified as the first row bonding pads which is close to the ring ground bonding surface and the second row bonding pads which is away from the ring ground bonding surface. The signal wire electrically connects to the signal bonding pads and the corresponding lead. The ground wires electrically connect to the first row bonding pads and the ring ground bonding surface.

34 Claims, 10 Drawing Sheets

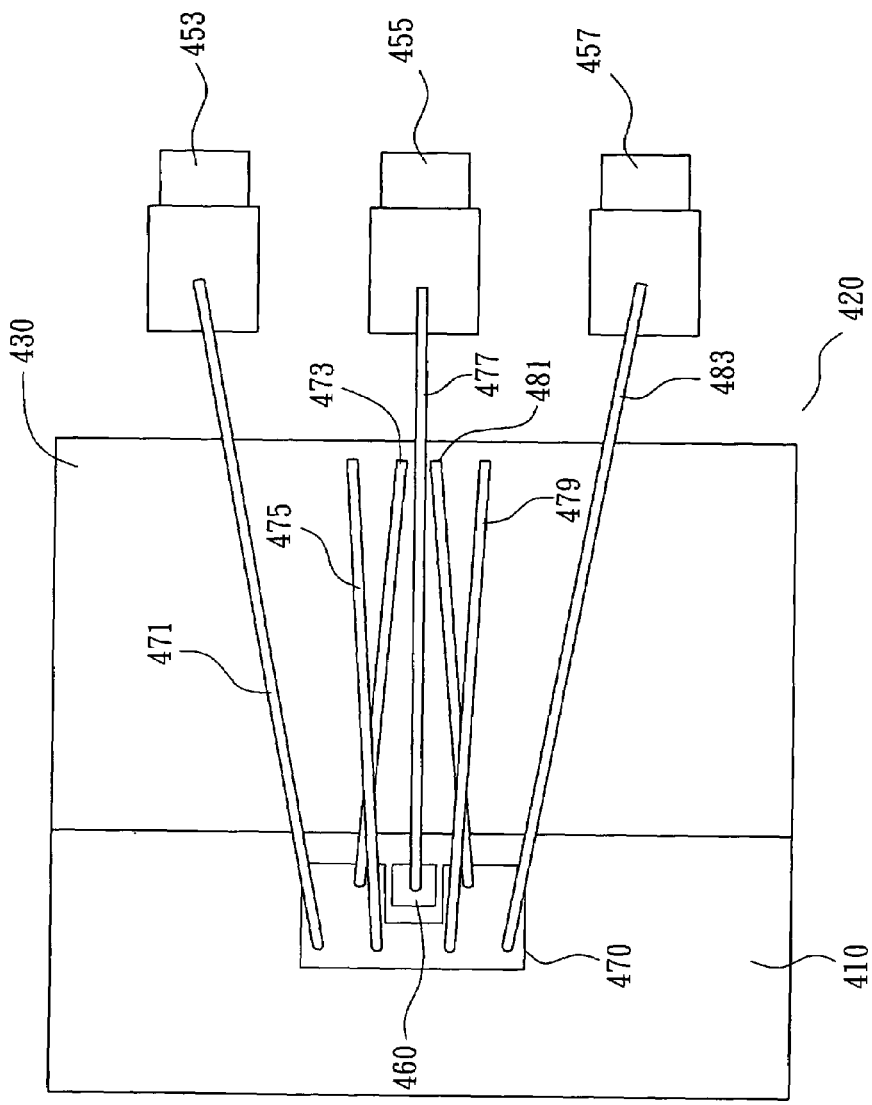

STRUCTURE OF MULTI-TIER WIRE BONDING FOR HIGH FREQUENCY INTEGRATED CIRCUIT

FIELD OF THE INVENTION

The present invention relates to a structure and a method of multi-tier wire bonding for high frequency integrated circuit, and more particular, to a structure and a method of multi-tier wire bonding for high frequency integrated circuit capable of optimizing the electrical connection between electronic devices.

DESCRIPTION OF THE PRIOR ARTS

Bond-wires are extensively used in the integrated circuit packaging for the interconnection between the die and the lead frames or the fingers on the printed circuit board (PCB) since they are inexpensive and robust. However, as the operating frequency moves beyond several giga-hertz, the parasitic inductance and the parasitic capacitance induced by the bonding wire will significantly impact the circuit performance and can no longer be neglected. Therefore, it is valuable to design the proper layout of the bond-wire structure to reduce the parasitic effects and hence to avoid the performance degradation of the designed circuits.

In general, the bonding wires between IC chips and other electronic devices in the packaging, including other IC chips, are not directly attaching to the surface thereof, but rather through the bonding pads thereon for achieving electrical connection between the chip and other electronic devices in the packaging. Moreover, the bonding-wires inside a packaging can be divided into two classes, i.e. signal wires and ground wires, according to the type of interconnecting signal.

The bonding-wire structure can have many variations for improving the electrical connection between the IC chip and other electronic devices in the packaging. For example, in order to reduce the parasitic inductance induced, a bonding-wire structure of prior arts adopts two ground wires arranged respectively at a side of a signal wire in parallel.

Please refer to FIG. 1, which is a 3D diagram depicting a conventional bond-wire structure for reducing the parasitic inductance. As seen in FIG. 1, the bonding-wire structure 100 comprises: a die 110 having a signal bonding pad 190 and a coplanar ground bonding pad 195; a die pad 125; three lead frames 160, 170, and 180 on a substrate 120; a signal wire 140 connecting the signal bonding pad 190 to the lead 170; and two ground wires 130, 150 connecting the coplanar ground bonding pad 195 respectively to the leads 160, 180; wherein the die 110 lies on top of a die pad 125 and the die pad 125 lies on top of a substrate 120, and the three metal wires 130, 140, 150 are adapted for enabling electrical connection between the die 110 and the substrate 120. In this regard, the signal wire 140 is used for signal transmission that is bonded from the signal bonding pad 190 of the die 110 to the lead 170 of the substrate 120, and the ground wires 130 and 150 are used for grounding that are bonded from the coplanar ground bonding pads 195 of the die 110 to the leads 160 and 180 respectively. The parasitic inductance of the structure 100 can be efficiently reduces when it is compared with the single bonding-wire structure. This is because the added ground wires 130, 150 are closer to the signal wire 140 than the ground plane (not shown) and hence the return currents in them can help to cancel the magnetic field much more.

The improvement of the coplanar bonding-wire structure shown in FIG. 1 has some limitations. This is because the bonding-wire pitch is obviously increased from the die side to the lead frame side. Since the lead-frame pitch is usually larger than 0.5 mm, the ends of the bonding wires are much far apart each other and hence the reduction of the signal loop is limited. As a result, the return loss of this bond-wire structure is usually less than 15 dB at 5 GHz since the decrease of the loop inductance is still not large enough. Therefore, the bonding-wire structure is required to be investigated and proper designed to lower the parasitic effects.

To improve the reduction of signal loop, a conventional bond-wire structure with shorter grounding distance is further provided. Please refer to FIG. 2, which is a sectional view depicting another conventional bonding structure with shorter grounding distance. As seen in FIG. 2, the bonding-wire structure 200 comprises: a die 240 with a bonding surface 241 arranged thereon four bonding pads, i.e. 243, 245, 247, and 249; a die pad 220; two lead frames, i.e. 250 and 255 on a substrate 210, and a ground plane 280; four bonding wires, i.e. 270, 273, 275, and 277; wherein electrical connections are enabled by using the bonding wires 270, 275 to connect the bonding pads 245, 247 respectively to the lead frames 250, 255, and also by using the bonding wires 273, 277 to connect the bonding pads 243, 249 respectively to the exposed die pad 220. In this regard, ground on the die 240 can be accomplished not only by connecting the bonding wire 270 to the corresponding lead frame 250 so as to connecting through the corresponding via hole 283 to the ground plane 280 of the substrate 210, but also can be accomplished by connecting the bonding wires 273, 277 to the exposed die pad 220 so as to be shorted to the ground directly through the via holes 285, 287, 289, 290. With this design of using the bonding wires 273 and 277, the bonding structure 200 can have a shorter ground path that the electrical characteristics of the whole package can be improved and may be suitable for RF applications.

However, although the conventional bonding structure shown in FIG. 2 can shorten the grounding path of the die 240, the arrangement of the bonding wires, i.e. 270, 273, 275, and 277, will still generate electromagnetic interference and hence affect the performance of the package.

Therefore, the present invention provides a structure and a method of multi-tier bonding for high frequency integrated circuit capable of increasing the return loss, reducing the insertion loss, and bettering the impedance matching condition, such that the overall high frequency response of the circuit can be enhanced.

SUMMARY OF THE INVENTION

It is therefore a primary objective of the claimed invention to provide a multi-wire wire-bonding structure suitable for a high frequency signal, comprising a first electronic device, a second electronic device, a chip carrier (die pad) and a plurality of metal wires. The first electronic device has a bonding surface and a first carrier surface in the opposite site of the bonding surface. The signal bonding pad and coplanar bonding pads surrounding with the signal bonding pad are located on the bonding surface of the first electronic device. The chip carrier has a second carrier surface and a third carrier surface. The second carrier surface attaches to the first carrier surface. The portion of the second carrier surface which exceeding the first carrier surface is a ring grounded bonding surface. The third carrier surface located at the opposite site of the second carrier surface. The second electronic device has a forth carrier surface, and a plurality of lead frames is arranged at the periphery of the forth carrier surface. The forth carrier surface attaches to the third carrier surface and the exceeding portion surrounds the first carrier surface. The lead frames surrounding the forth carrier surface are corresponding to the signal bonding pad and the coplanar bonding pads. Moreover, the metal wires comprises a signal wire and grounding wires. The signal wire electronically connects between the signal bonding pad and one of the lead frames. The grounding wires electronically connect between the coplanar bonding pads and the ring ground bonding surface or the lead frames on the second electronic device. According to the location of the metal wires, they can be divided into the first row and the second row. The first row is close to the ring grounded bonding surface whereas the second row is away from the ring grounded bonding surface. The grounding wires electrically connect to the ring grounded bonding surface.

This invention provides a method for bonding multi-wires on a wire-bonding structure, the wire-bonding structure suitable for a high frequency signal. This method comprises steps of forward bonding the signal wires from the bonding pad of a first electronic device and ending at one of the corresponding lead frames on a second electronic device, forward bonding part of the grounding wires from the first row of the coplanar bonding pads and ending at the ring grounded bonding surface, and forward bonding part of the grounding wires from the second row of the coplanar bonding pads and ending at corresponding lead frames and the ring grounded bonding surface.

In conclusion, this invention provides a structure and method of multi-wire wire bonding suitable for a high frequency signal. By adding grounding wires at the surrounding area of the signal wire, and connecting part of the grounding wires to the chip carrier (die pad), the return loss and the impedance matching are increased, the insertion loss of the chip is reduced, and the high frequency response of the circuit is improved The various objects and advantages of the present invention will be more readily understood from the following detailed description when read in conjunction with the appended drawings.

BRIEF DESCRIPTION OF THE DRAWINGS

FIG. 4A and FIG. 4B shows the top view and the 3D diagrams of the multi-wire wire bonding structure of the embodiment B in this invention.

DETAILED DESCRIPTION OF THE PRESENT INVENTION

Because the conventional bonding structure generates big parasitic inductance, and electromagnetic interference (noise), this invention does not only use a coplanar bonding pad on the IC chip, but also bonding the grounding wires of the coplanar bonding pad to the die pad below the chip in order to shorten the path of the grounding. This invention also adding the grounding wires bonding to the die pad and has a better arrangement of the grounding wires in order to decrease the insertion loss and increase the return loss and to improve the electrical characteristic of the bonding structure.

This invention provides a structure and method of multi-wire wire bonding that there are coplanar bonding pads at the chip. Part of the grounding wires connect to the die pad, part of the grounding wires connect to the lead frames. In addition, the number of the grounding wires is increased.

Figure 2:
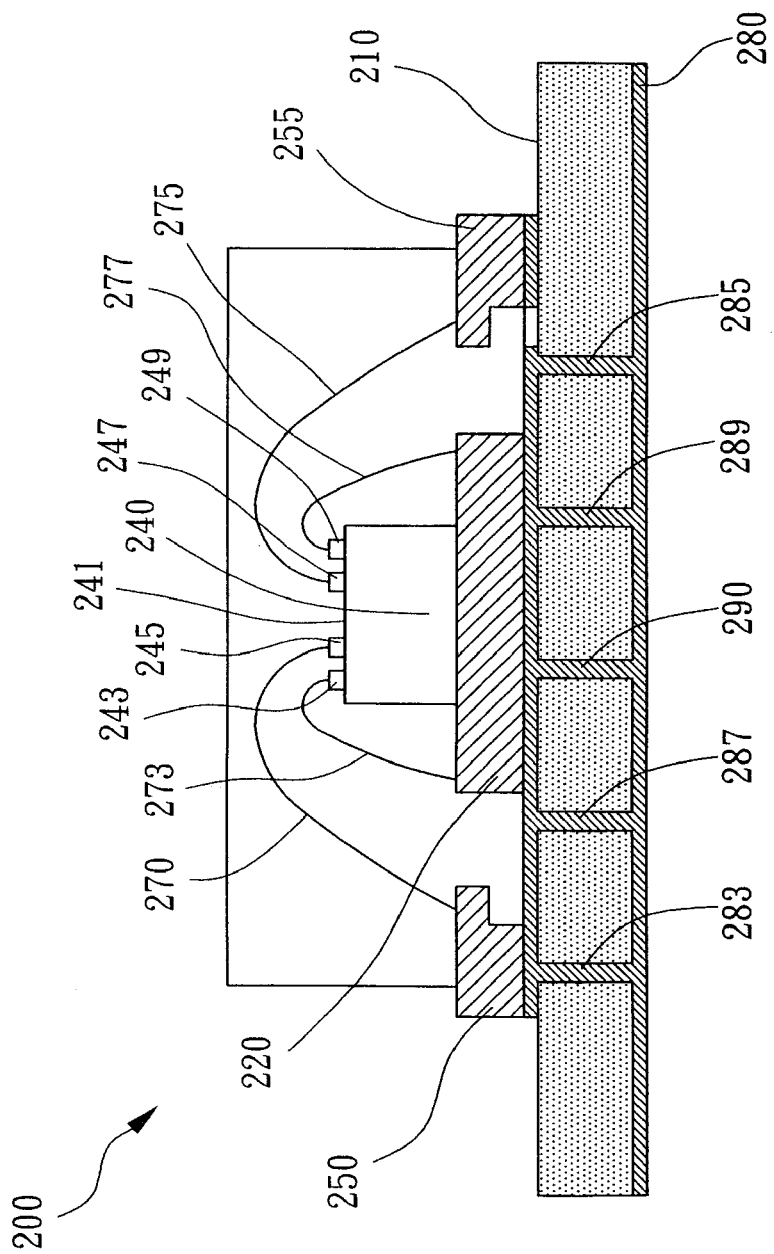
FIG. 2 shows the conventional multi-wire wire bonding structure for a high frequency signal.
Figure 3A:
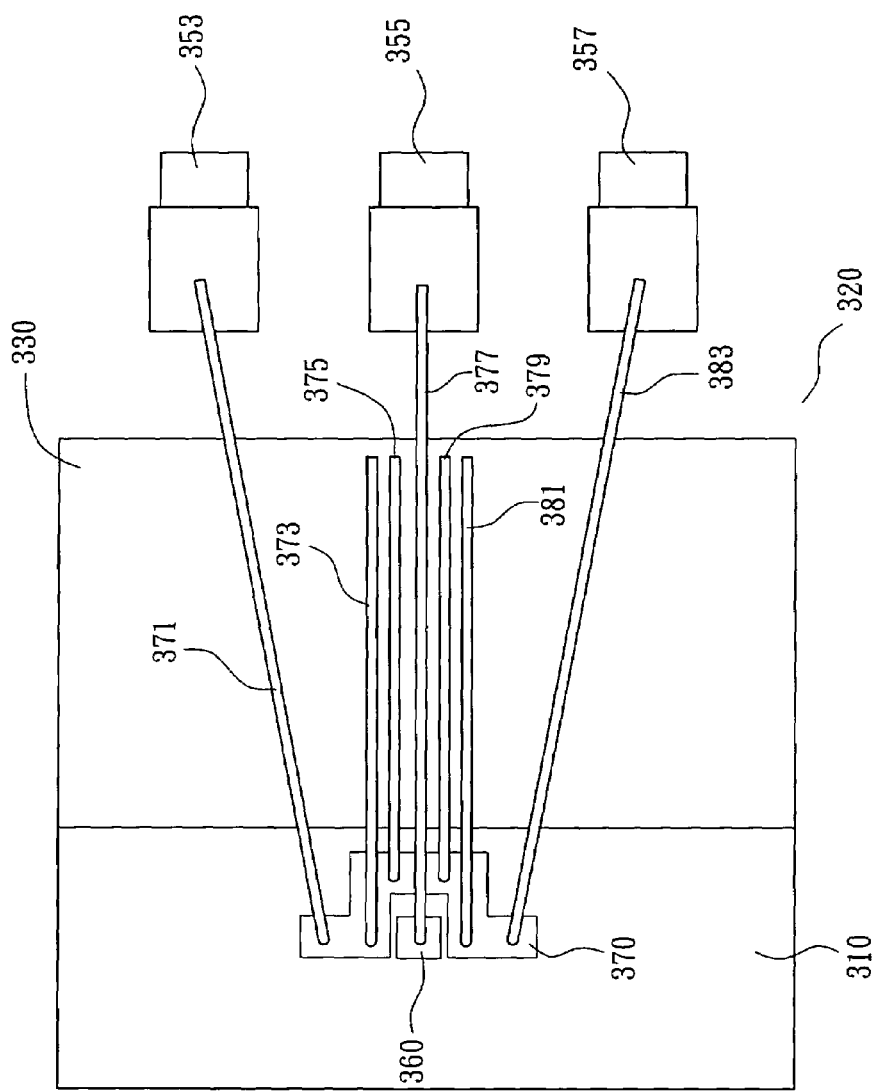
FIG. 3A and FIG. 3B shows the top view and the 3D diagrams of the multi-wire wire bonding structure of the embodiment A in this invention.
Figure 3B:
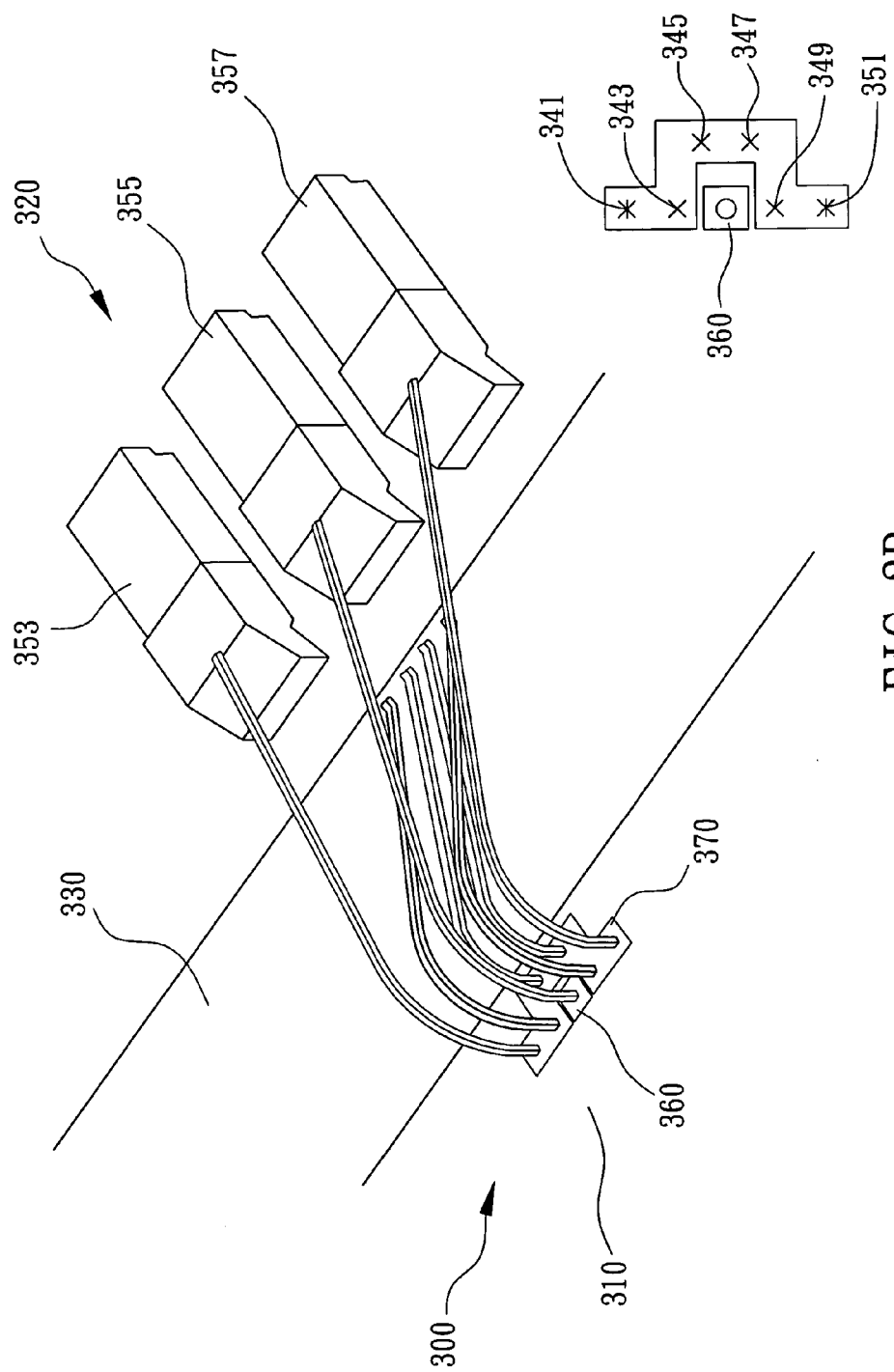

Please refer to FIGS. 3A and 3B. FIGS. 3A and 3B demonstrated the top-view and 3D diagram of an embodiment of this invention. The structure 300 has a first electronic device 310 (such as a chip), a second electronic device 320 (such as a substrate) and a die pad 330. The chip 310 attaches to the substrate 320 with the die pad 330. The chip 310, die pad 330 and the substrate 320 are overlapped and form a stair-like structure (The overlapped stair-like structure form by the chip 310, die pad 330 and substrate 320 from is like the structure of the chip 240, epoxy 220 and the substrate 210 in the FIG. 2). In the chip 310, the opposite surface in corresponding to the die pad 330 has a signal bonding pad 360 and the coplanar bonding pads 370 surrounding the signal bonding pad 360. The die pad 330 is facing to the chip 310 and the exceeding portion forms a ring grounded bonding surface. The substrate 320 is facing the die pad 330 and the 4 edges are exceeding the die pad 330. There are a plurality of lead frames 353, 355 and 357 locate at the exceeding portion substrate 320 in corresponding to the signal bonding pad 360 and the coplanar bonding pads 370.

The chip 310 and the substrate 320 are electronically connected with a plurality of metal wires 371 to 383. The metal wires 371 to 383 are classified as a signal wire 377 and the grounded wires 371 to 375, 379 to 383. The grounded wires 371 to 375, 379 to 383 are interlaced arranged surrounding the signal wire 377. In this embodiment, the coplanar bonding pads 370 are U-shaped. The coplanar bonding pads 370 comprises six grounded bonding pads 341 to 351. The grounded bonding pads 341 to 351 and the signal bonding pad 360 are formed two rows of bonding locations on the coplanar bonding pads 370. One row is close to the ring grounded bonding surface 330 and the other row is away from the ring grounded bonding surface 330.

The signal wire 377 is electrically connecting between the signal bonding pad 360 and the corresponding lead frame 355. The grounding wires 373, 375, 379 and 381 are electrically connecting between the grounded bonding pads 343, 345, 347, 349 of the coplanar bonding pads 370 and the corresponding locations on the ring grounded bonding surface 330 respectively. The grounding wires 371, 383 are electrically connecting between the grounded bonding pads 341, 351 of the coplanar bonding pads 370 and the corresponding lead frames 353, 357 on the substrate 320 respectively.

Figure 1:
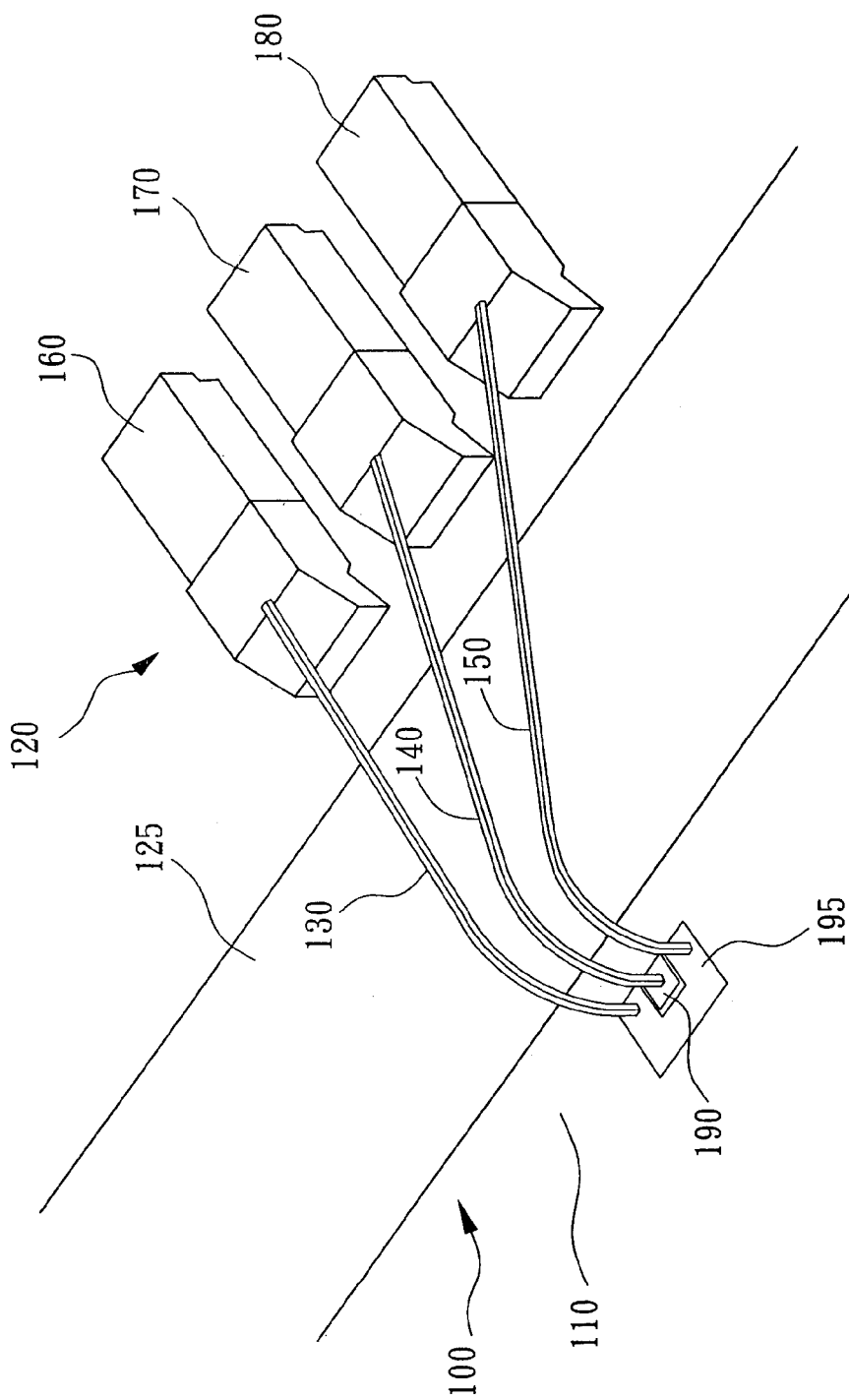
FIG. 1 shows the circuit to reduce the parasitic inductance, capacitance in the conventional bonding structure.

In comparing with the conventional structure 100 in FIG. 1, the structure 300 of this invention has added 4 interlaced arranged grounding wires 343 to 349 surrounding the signal wire 377. These 4 added grounding wires are close to the signal wire. These 4 grounding wires connect between the ring grounded bonding surface 330 and the bonding pads of the chip 310 located close to the edge of the ring grounded bonding surface 330. Therefore, in the structure 330, the path of the signal loop is shortened, and the parasitic inductance is reduced.

Figure 4B:
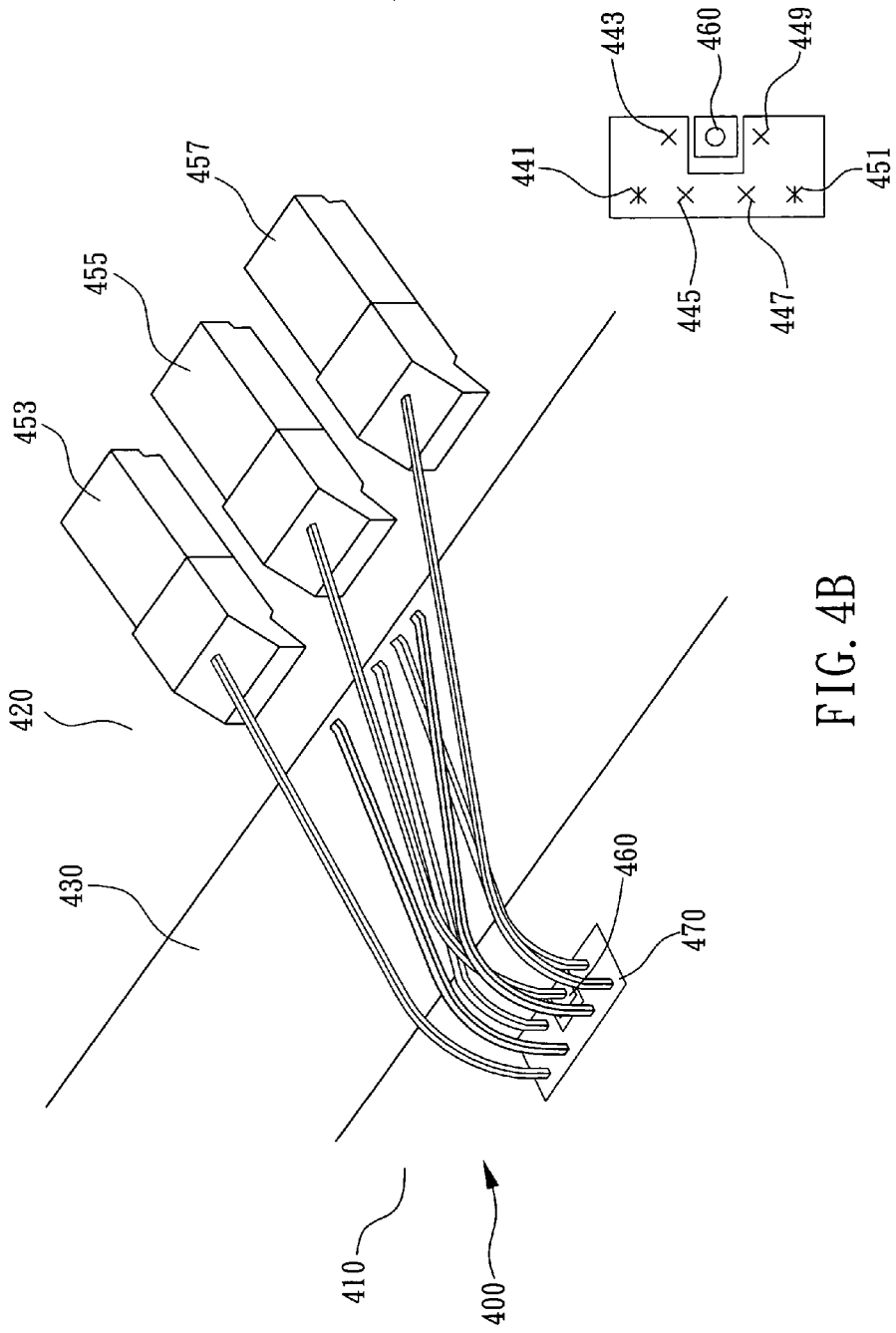

In order to have a better arrangement of the grounding metal wires, this invention provides interlaced arrangement of the grounding metal wires. FIGS. 4A and 4B demonstrate the top-view and 3D diagram an embodiment of this invention. The structure 400 includes a chip 410, a substrate 420 and a die pad 430. The chip 410 attaches to the substrate 420 with the die pad 430. The chip 410, die pad 430, and the substrate 420 are overlapped and formed a stair-like structure. The surface of chip 410 facing to the die pad 430 has the signal bonding pad 460 and surrounding coplanar bonding pads 470. The surface of the die pad 430 facing to the chip 410 is exceeding the chip 410, wherein the exceeding portion forms a ring grounded bonding surface 430. The substrate 420 is exceeding the die pad 430 and 453, 455, 457 are on the exceeding portion of the lead frames.

The signal conducting between the chip 410 and the substrate 420 is through the metal wires 471 to 483. The metal wire 477 is the signal wire whereas the metal wires 471 to 475, 479 to 483 are the grounding wires. The grounding wires 471 to 475, 479 to 483 are surrounding the signal wire 477. In this embodiment, the coplanar bonding pads 470 is U-shaped and can be symmetrically divided into six grounded bonding pads 441 to 451. The six grounded bonding pads and the signal bonding pad 460 are formed two rows of bonding locations. One row is close to the ring grounded bonding surface 430 and the other row is away from the ring grounded bonding surface 430.

The signal wire 477 is electrically connecting to the signal bonding pad 460 of the chip 410 and the corresponding lead frame 455 on the substrate 420. The grounding wires 473, 475, 479 and 481 are electrically connecting to the grounded bonding pads 443, 445, 447 and 449 of the coplanar bonding pad 470 and the corresponding pads of the ring grounded bonding surface 430, in respectively. The grounding wires 473, 475, 479 and 481 are interlaced arranged with the signal wire 447. The grounding wires 473 and 475 are crossed arranged whereas the grounding wires 479 and 481 are crossed arranged. The grounding wires 471 and 483 are electrically connecting to the grounded bonding pads 441 and 451 of the coplanar bonding pads 470 and the corresponding lead frames 453 and 457 on the substrate 420, in respectively.

In the structure 400, the chip 410 uses two interlaced arranged the grounding wires 471 and 483 to electrically connect to the lead frames 453 and 457 of the substrate 420. The chip 410 uses two pairs of crossed arranged grounding wires 473, 475, 479 and 481 to electrically connect to the ring grounded bonding surface of the die pad 430.

In comparing with the condition A, the signal wires in the condition B are moved from the second row of the bonding pad to the first row which is closer to the ring grounded bonding surface 430. In consequence, the length of the signal wire is shortened and the parasitic inductance of the signal wire is reduced. In condition B, there are still four added interlaced arranged grounding wires surrounding the signal wire. These four grounding wires have shorter signal path than that in the condition A.

Figure 5A:
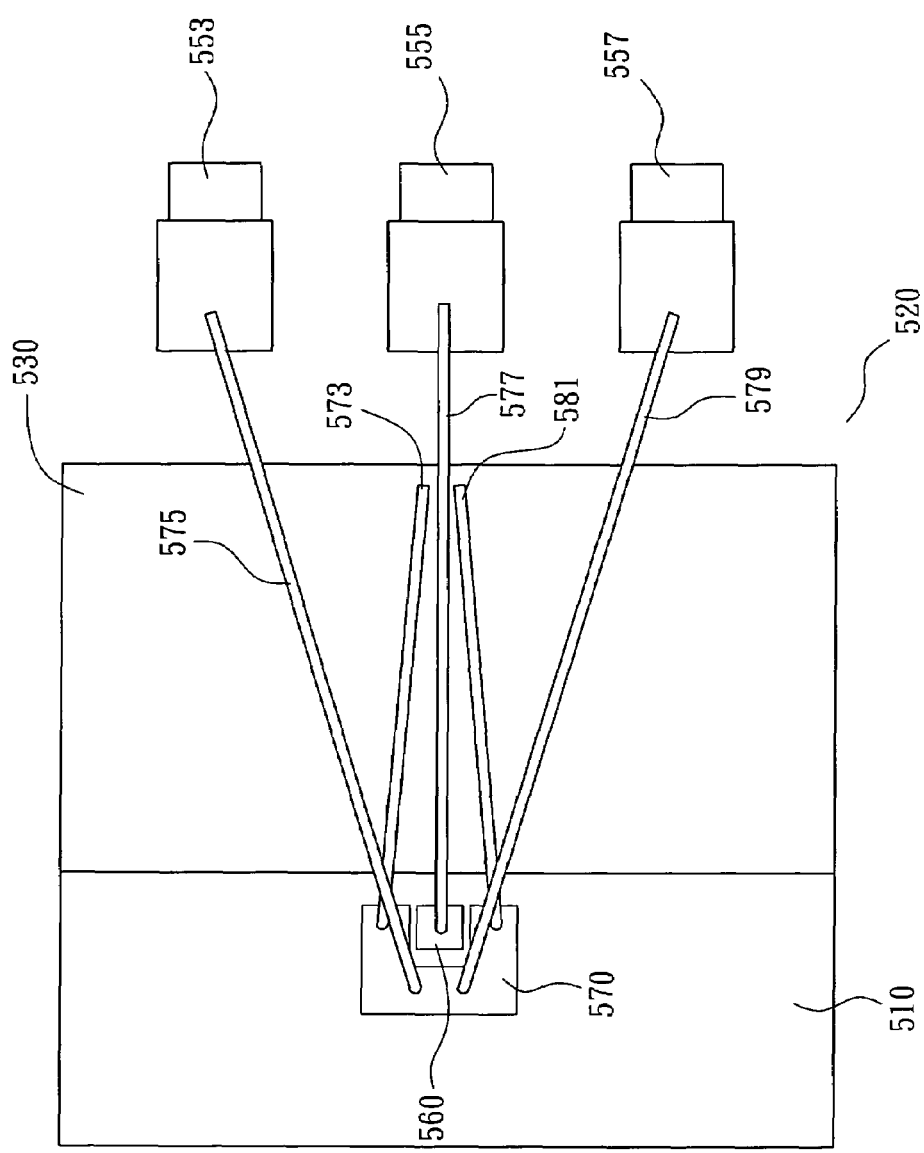
FIG. 5A and FIG. 5B shows the top view and the 3D diagrams of the multi-wire wire bonding structure of the embodiment C in this invention.
Figure 5B:
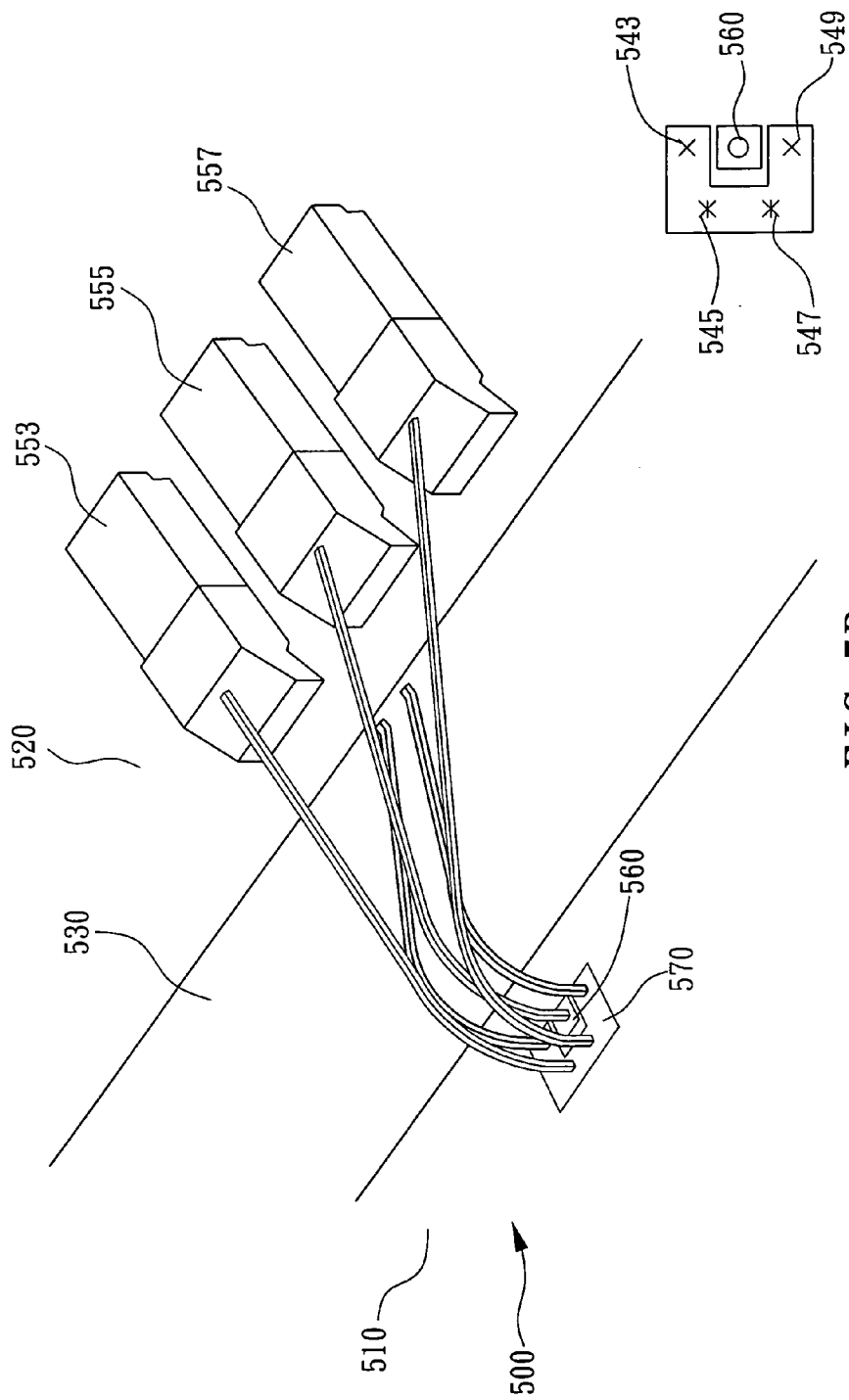

This invention provides another embodiment in illustrated in FIG. 5A and FIG. 5B. FIGS. 5A and 5B demonstrate the top-view and 3D diagram of another embodiment C. The structure 500 is similar to the structure 400 in the embodiment B. The structure 500 includes a chip 510, a substrate 520, and a die pad 530. The chip 510 attaches to the substrate 520 with the die pad 530. The chip 510, die pad 530 and the substrate 520 are overlapped and formed a stair-like structure. On the chip 510, the surface of chip 510 facing to the die pad 430 has a signal bonding pad 560 and coplanar bonding pads 570. The surface of the die pad 530 facing to the chip 510 is exceeding the chip 510, wherein the exceeding portion forms a ring grounded bonding surface 530. The substrate 520 is exceeding the die pad 530 and 553, 555, 557 are on the exceeding portion of the lead frames.

The signal conducting between the chip 510 and the substrate 520 is through the metal wires 573 to 581. The metal wires 577 is the signal wire whereas the metal wires 573, 575, 579, 581 are grounding wires. The grounding wires 573, 575, 579, 581 are surrounding the signal wire 577. In this embodiment, the coplanar bonding pad 570 is U-shaped and can be symmetrically divided into four grounded bonding pads 543, 545, 547, 549. The four bonding pads and the signal bonding pad 560 form two rows of bonding locations. One row is close to the ring grounded bonding surface 530 and the other row is away from the ring grounded bonding surface 530.

The signal wire 577 is electrically connecting between the signal bonding pad 560 and the corresponding lead frame 555. The grounding wires 573, 581 are electrically connecting between the grounded bonding pads 543, 549 of the coplanar bonding pad 570 and the corresponding grounded bonding pads of the ring grounded bonding surface 530, in respectively. The grounding wires 575, 579 are electrically connecting to the bonding pads 545 and 547 of the coplanar bonding pad 570 and the corresponding lead frames 553, 557 on the substrate 520.

The structure 500 is adopted from the embodiment B but the two grounding wires close to two sides the U-shaped coplanar bonding pad 570 are removed. The grounding wires 575, 579 are only located at the bonding pads 545 and 547 which are close to the tip of the U-shaped coplanar bonding pads 570. In comparing with the structure 400 in the embodiment B, the grounding wires 575, 579 connect to the bonding pads 545, 547 of the chip 510 and the lead frames 553, 557 of the substrate 520 in respectively.

Because fewer bonding wires are need by the structure 500 in the embodiment C, the cost is cheaper than in the embodiment A and B. The electrical characteristic is not decreased because the grounding wires 573, 575, 579, and 581 which connect to the lead frames 553, 557 and the ring grounded bonding surface 530 are still well surrounding the signal wire 577.

In all the embodiments, the parasitic capacitance is slightly increased and the parasitic inductance is significantly reduced or removed by adding the grounding wires connecting to the die pad. Therefore, the return loss of the embodiments is better than the conventional bonding structure. Especially in the embodiments B and C, the parasitic inductance is reduced and the impedance matching is better than in the embodiment A. The reason is that the grounding wires surround the signal wire. In summary, the three embodiments of this invention have reduced the electromagnetic interference by using the grounding wires to surround the signal wire.

Figure 6:
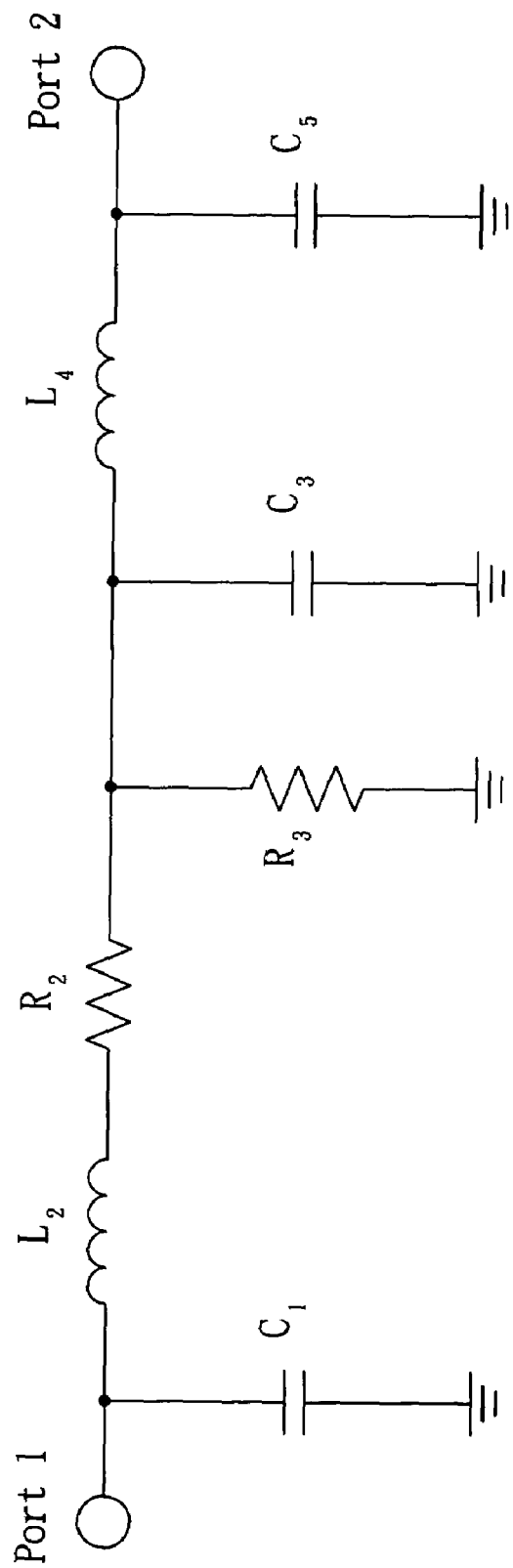
FIG. 6 shows the equivalent circuit of the multi-wire bonding structure.

The experimental data has proved the performance of the embodiments in this invention is better than in the conventional bonding structure. In the FIGS. 1, 4 and 5, the metal wires connect between the chip and the substrate, the metal wires connect between the signal bonding pad, the coplanar bonding pad, die pad, and lead frames can be illustrated by an equivalent circuit. FIG. 6 shows the equivalent circuit of the multi-wires wire-bonding structure.

The performance of the multi-wire wire-bonding structures can be evaluated by the changed of the inductance, capacitance and resistance in FIG. 6. Please refer to table 1. Table 1 demonstrates the values of each of the inductance, capacitance and resistance in FIG. 6 under various conditions. Table 1 shows that the conventional bonding structure has the highest inductance and the lowest capacitance which the worst impedance matching among all embodiments. Table 1 also shows that the inductance has been significantly reduced and the capacitance has been slightly increased in the embodiments A, B, and C. Thus, the return loss in the embodiments A, B and C are better than the conventional bonding structure. In comparing with the condition A, the condition B and C not only significantly have reduced the inductance but also have improved the impedance matching.

Figures 7A, 7B:
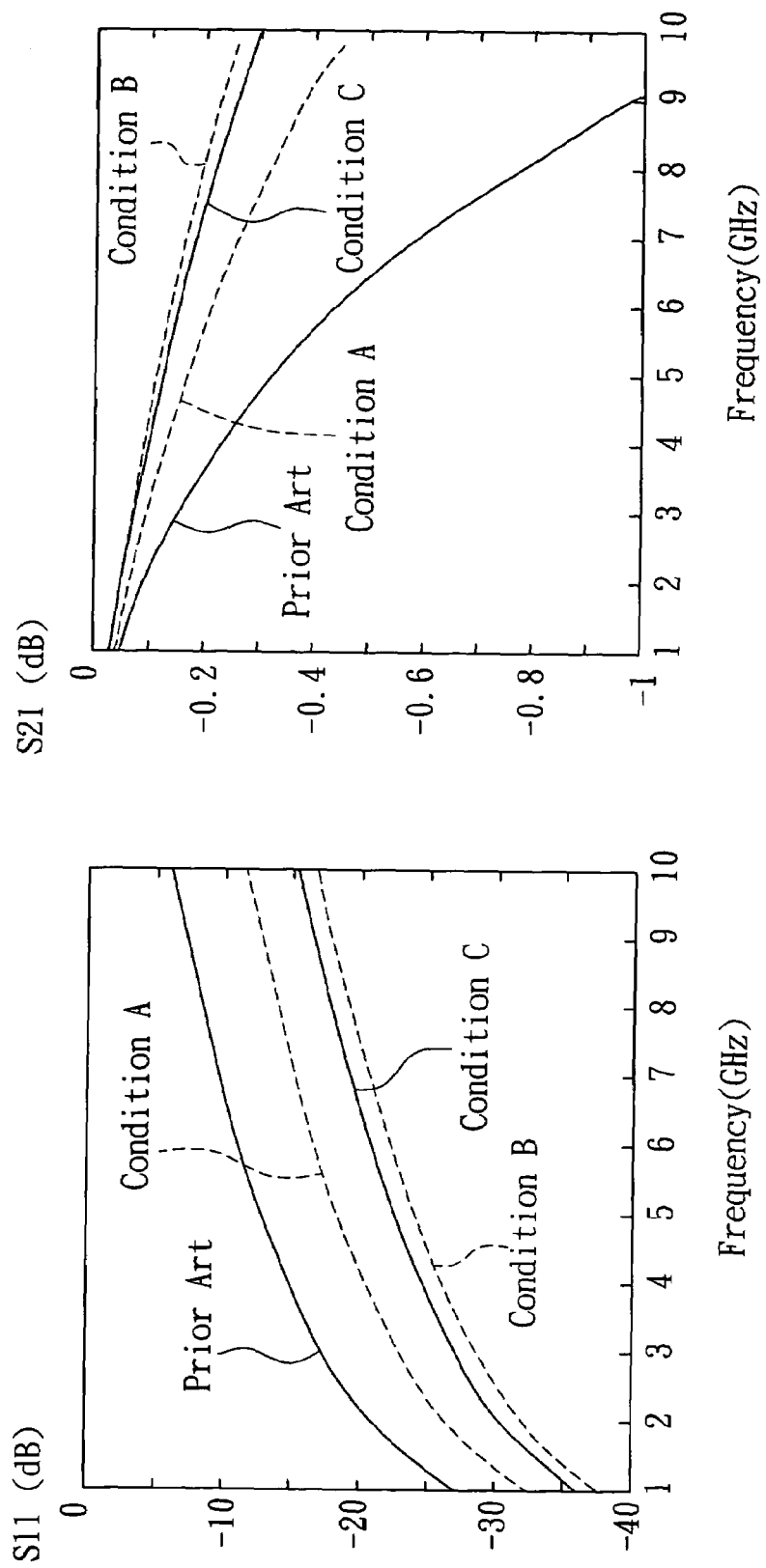
FIG. 7A and FIG. 7B show the return loss-working frequency plot and insertion loss-working frequency plot in respectively.

Please refer to Table 2. Table 2 shows the insertion loss and the return loss of the embodiments and the conventional bonding structure at different working frequency. In conventional bonding structure, the insertion loss and the return loss are normal only when the working frequency is at 2.5 GHz. If the working frequency exceeding 2.5 GHz, the return loss is too small and the insertion loss is too huge in the conventional bonding structure. In the embodiments of this invention, the insertion loss and the return loss are normal up to above 5 GHz working frequency. In condition B and C, the insertion loss and the return loss are normal up to 10 GHz working frequency. The return loss is considered normal only when it is larger than 15 dB whereas the insertion loss is considered normal when it is less than 0.3 dB. In the conventional bonding structure, the return loss and insertion loss are 7 dB and 1.2 dB in respectively. Thus, the condition B and C have improved up to 10 dB and 1 dB in the return loss and the insertion loss, in respectively. Table 2 is further illustrated by the FIGS. 7A and 7B. The FIG. 7A shows the return loss working frequency plot. The FIG. 7B shows the insertion loss-working frequency plot. FIG. 7A shows that the embodiments A, B, and C are better than the conventional bonding structure in the return loss. FIG. 7B shows that the embodiments A, B, and C are better than the conventional technique in the insertion loss. As the working frequency increased, the difference between the embodiments and the conventional bonding structure increased.

While the present invention has been shown and described with reference to preferred embodiments thereof, and in terms of the illustrative drawings, it should be not considered as limited thereby. Various possible modification, omission, and alterations could be conceived of by one skilled in the art to the form and the content of any particular embodiment, without departing from the scope and the spirit of the present invention.

TABLE 1

| | Parameters of Lumped Circuit of FIG. 6 | Approximate $L_{total} \approx C_{total}$ |
|---|---|---|
| Prior Art | $C_1$ = 0.114 pF, $C_3$ = 0.257 pF, $C_5$ = 0.036 pF, $L_2$ = 1.325 nH, $L_4$ = 0.385 nH, $R_2$ = 0.400 Ω, $R_3$ = 13.239 KΩ | $C_{total} \approx 0.407$ pF, $L_{total} \approx 1.710$ nH |
| Condition A | $C_1$ = 0.122 pF, $C_3$ = 0.240 pF, $C_5$ = 0.078 pF, $L_2$ = 0.919 nH, $L_4$ = 0.551 nH, $R_2$ = 0.445 Ω, $R_3$ = 10.213 KΩ | $C_{total} \approx 0.440$ pF, $L_{total} \approx 1.470$ nH |
| Condition B | $C_1$ = 0.115 pF, $C_3$ = 0.245 pF, $C_5$ = 0.077 pF, $L_2$ = 0.757 nH, $L_4$ = 0.529 nH, $R_2$ = 0.333 Ω, $R_3$ = 17.998 KΩ | $C_{total} \approx 0.437$ pF, $L_{total} \approx 1.286$ nH |
| Condition C | $C_1$ = 0.115 pF, $C_3$ = 0.243 pF, $C_5$ = 0.076 pF, $L_2$ = 0.788 nH, $L_4$ = 0.524 nH, $R_2$ = 0.372 Ω, $R_3$ = 14.614 KΩ | $C_{total} \approx 0.434$ pF, $L_{total} \approx 1.312$ nH |

TABLE 2

| | 2.5 GHz | | 5 GHz | | 10 GHz | |
|---|---|---|---|---|---|---|
| | Return Loss(dB) | Insertion Loss(dB) | Return Loss(dB) | Insertion Loss(dB) | Return Loss(dB) | Insertion Loss(dB) |
| Prior Art | 19.37 | 0.12 | 13.42 | 0.32 | 6.86 | 1.23 |
| Condition A | 24.71 | 0.08 | 18.80 | 0.16 | 12.29 | 0.45 |
| Condition B | 30.10 | 0.07 | 24.17 | 0.12 | 17.01 | 0.26 |
| Condition C | 28.79 | 0.07 | 22.85 | 0.12 | 15.78 | 0.29 |

What is claimed is:

1. A structure of multi-tier wire bonding for high frequency integrated circuit, comprising:
   a first electronic device, comprising:
      a wire-bonding surface;
      a first carrier surface, arranged on the opposite side of the wire-bonding surface;
      at least a signal bonding pad, located at the border of the wire-bonding surface; and
      at least a coplanar boding pad, located at the wire-bonding surface and surrounding the signal bonding pad; and
   a second electronic device, comprising:
      a second carrier surface, abutted to the first carrier surface, having a border portion of the second carrier surface not covered by the first carrier surface and surrounding the first carrier surface;
      a plurality of leads, being arranged at the border portion of the second carrier surface and being positioned in correspondence to the signal bonding pad and the coplanar bonding pad; and
      a plurality of metal wires, including at least a signal wire and a plurality of ground wires,
   wherein the signal wire is electrically connected between the signal bonding pad and the lead corresponding to the signal bonding pad, the ground wires are electrically connected between the coplanar bonding pad and a linear bonding pad which is the border portion of the second carrier surface surrounding the first carrier surface.

2. The bonding wire structure according to claim 1, wherein the signal wire and the ground wires are interlaced arranged.

3. The bonding wire structure according to claim 1, wherein the coplanar bonding pad is a U-shaped structure, the concave side of the U-shaped structure surrounds the signal bonding pad and the convex side is facing to the signal bonding pad.

4. The bonding wire structure according to claim 3, wherein two ground wires are arranged symmetrically at the convex side of said coplanar bonding pad.

5. The bonding wire structure according to claim 4, wherein two ground wires are electrically connected to the second carrier surface.

6. The bonding wire structure according to claim 5, wherein two pairs of ground wires are arranged respectively and symmetrically at the two sides of said concave side of the U-shaped structure.

7. The bonding wire structure according to claim 6, wherein the two proximal ground wires are electrically connected to the second carrier surface.

8. The bonding wire structure according to claim 7, wherein the two distal ground wires are electrically connected to the leads.

9. The bonding wire structure according to claim 1, wherein the coplanar bonding pad is a U-shaped structure, and a concave side of the U-shaped structure is facing to the leads.

10. The bonding wire structure according to claim 9, wherein two grounded wires are arranged respectively at the two sides of said concave side of the U-shaped structure.

11. The bonding wire structure according to claim 10, wherein each of the two ground wires electrically connects to the second carrier surface.

12. The bonding wire structure according to claim 11, wherein four ground wires are located at the concave side of said U-shaped structure.

13. The bonding wire structure according to claim 12, wherein the two proximal ground wires located close to the center of concave side of the U-shaped structure are electrically connected to the second carrier surface.

14. The bonding wire structure according to claim 13, wherein said two distal ground wires are electrically connected to the grounded leads.

15. The bonding wire structure according to claim 13, wherein said signal wire and said ground wires are interlaced arranged.

16. The bonding wire structure according to claim 10, wherein two ground wires are symmetrically located to the concave tip of the U-shaped structure.

17. The bonding wire structure according to claim 10 wherein said two ground wires electrically connect to the grounded leads.

18. A structure of multi-tier wire bonding for high frequency integrated circuit, comprising:
at least one high frequency signal bonding pad located at a chip side;
at least one ground coplanar bonding pad surrounding said high frequency signal bonding pad;
a plurality of leads located at a package side; and
at least a ground surface;
wherein said high frequency signal bonding pad is connected to a corresponding lead of the package side using normal bonding, and there are at least two ground loops comprise a first ground loop and a second ground loop, the first group loop is closer to said high frequency signal bonding pad than the second ground loop.

19. The bonding wire structure of claim 18, wherein said first ground loop is started at the first row of said ground bonding pad and said second group loop is started at the second row of said ground bonding pad, the first row is closer to the ground surface than the second row.

20. The bonding wire structure of claim 19, wherein the two ground wires of said first set ground loop are formed by reverse bonding method.

21. The bonding wire structure of claim 20, wherein the two ground wires of said second ground loop are formed by normal bonding method.

22. The bonding wire structure of claim 20, wherein the two ground wires of said second ground loop are formed by reverse bonding method.

23. The bonding wire structure of claim 22, wherein said first ground loop and said second ground loop are interlaced arranged around the high frequency signal bonding.

24. The bonding wire structure of claim 23, further comprising a third ground loop having two ground wires, wherein the third ground loop is neighbor to the high frequency signal bonding, said second ground loop is closer to said high frequency signal bonding than the third ground loop.

25. The bonding wire structure of claim 24, wherein the third ground loop starts from the second row of said ground coplanar bonding pad.

26. The bonding wire structure of claim 25, wherein the two ground wires of said third ground loop are formed by normal bonding method.

27. The bonding wire structure of claim 26, wherein said ground coplanar bonding pad is a U-shaped structure and a convex side of said U-shaped structure facing said ground surface and the concave side of said U-shaped structure surrounds said high frequency signal bonding pad.

28. The bonding wire structure of claim 27, wherein the two ground wires of the first ground loop each has an end locates at the ground coplanar bonding pad.

29. The bonding wire structure of claim 28, wherein the two ground wires of the second ground loop each has an end locates oppositely at a side of the concave side of said ground coplanar bonding pad.

30. The bonding wire structure of claim 29, wherein the two ground wires of the third grounded loop each has an end locates oppositely at a side of the concave side of said ground coplanar bonding pad.

31. The bonding wire structure of claim 26, wherein the concave side of said ground coplanar bonding pad is facing said ground surface.

32. The bonding wire structure of claim 31, wherein the two ground wires of the first ground loop are respectively arranged at the two opposite sides of the concave side of said ground coplanar bonding pad.

33. The bonding wire structure of claim 32, wherein the second and the third ground loops are arranged at the convex side of said ground coplanar bonding pad.

34. The bonding wire structure of claim 21, wherein the concave side of said ground coplanar bonding pad is facing said ground surface.

* * * * *